(12) United States Patent
Moon et al.

(10) Patent No.: US 6,870,173 B2
(45) Date of Patent: Mar. 22, 2005

(54) ELECTRON-BEAM FOCUSING APPARATUS AND ELECTRON-BEAM PROJECTION LITHOGRAPHY SYSTEM EMPLOYING THE SAME

(75) Inventors: Chang-wook Moon, Seoul (KR); In-kyeong Yoo, Suwon (KR); Dong-wook Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/792,849

(22) Filed: Mar. 5, 2004

(65) Prior Publication Data

US 2004/0173755 A1 Sep. 9, 2004

(30) Foreign Application Priority Data

Mar. 7, 2003 (KR) ................................ 10-2003-0014483

(51) Int. Cl.⁷ .............................................. H01J 37/317
(52) U.S. Cl. ................................ 250/492.24; 250/492.2
(58) Field of Search .......................... 250/492.24, 492.2

(56) References Cited

U.S. PATENT DOCUMENTS 4,705,956 A * 11/1987 Ward ........................ 250/492.2

* cited by examiner

*Primary Examiner*—Kiet T. Nguyen
(74) *Attorney, Agent, or Firm*—Lee, Sterba & Morse, P.C.

(57) ABSTRACT

An electron-beam focusing apparatus for controlling a path of electron beams emitted from an electron-beam emitter in an electron-beam projection lithography (EPL) system includes top and bottom magnets for creating a magnetic field within a vacuum chamber, the top and bottom magnets disposed above and below the vacuum chamber into which a wafer is loaded, respectively; upper and lower pole pieces magnetically contacting the top and bottom magnets, respectively, the upper and lower pole pieces penetrating a top wall and a bottom wall of the vacuum chamber, respectively; and upper and lower projections having a circular shape, extending outwardly from facing surfaces of the upper and lower pole pieces, respectively.

24 Claims, 5 Drawing Sheets

ELECTRON-BEAM FOCUSING APPARATUS AND ELECTRON-BEAM PROJECTION LITHOGRAPHY SYSTEM EMPLOYING THE SAME

BACKGROUND OF THE INVENTION

1. Field of the Invention

The present invention relates to an electron-beam projection lithography (EPL) system. More particularly, the present invention relates to an electron-beam focusing apparatus for controlling a path of an electron beam emitted from an electron-beam emitter and an EPL system using the same.

2. Description of the Related Art

During a semiconductor manufacturing process, various lithographic techniques are employed to form a desired pattern on a surface of a substrate. Conventional optical lithography using light, such as ultraviolet rays, has a limit with respect to a line width that can be implemented with such a technique. For this reason, next generation lithography (NGL) techniques have been recently proposed, by which more miniaturized and integrated semiconductor integrated circuits (ICs) having nano-scale line widths can be realized. Examples of the NGL techniques include electron-beam projection lithography (EPL), ion projection lithography (IPL), extreme ultraviolet lithography (EUVL), and proximity X-ray lithography.

Among the NGL systems, EPL systems for patterning an electron-resist coated on a substrate to be processed into a desired form using electron-beams emitted from an emitter are currently in wide use since they have a simple structure and it is easy to implement a large-area electron-beam emitter.

Figure 1:
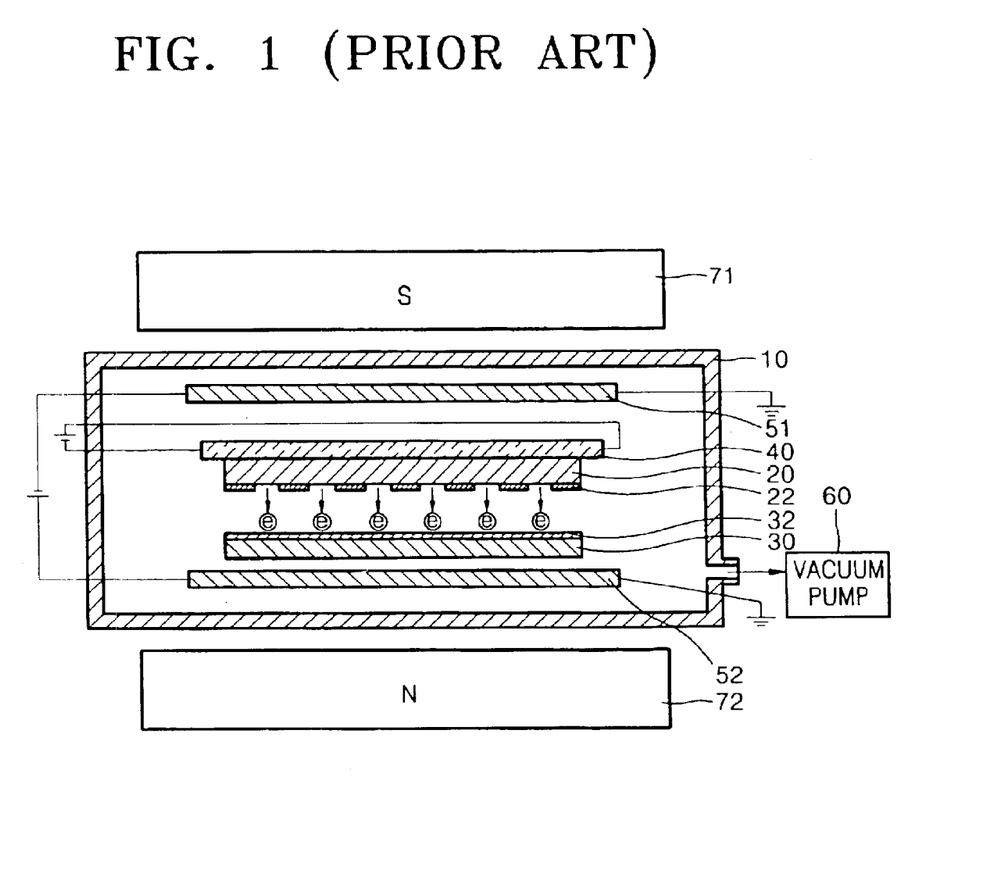
FIG. 1 schematically illustrates a configuration of a conventional electron-beam projection lithography (EPL) system.

FIG. 1 schematically illustrates a configuration of a conventional electron-beam projection lithography system including a vacuum chamber 10 in which a wafer 30 is processed. Since an interior of the vacuum chamber 10 is maintained at a predetermined vacuum pressure by a vacuum pump 60, the vacuum chamber 10 is usually made of a steel plate having a high strength.

An electron-beam emitter 20 for emitting electron beams is disposed within the vacuum chamber 10. The wafer 30 to be processed is spaced a predetermined distance apart from the electron-beam emitter 20. A mask 22 having a predetermined pattern is located on a surface of the electron-beam emitter 20 so that the electron beam is emitted by the emitter 20 through a portion exposed by the mask 22. The electron beam thus emitted is used to pattern an electron resist 32 coated on the surface of the wafer 30 in the same pattern as the exposed surface of the emitter 20.

A heater 40 for heating the emitter 20 for emission of electron beams is placed at a rear side of the electron-beam emitter 20. In addition to heating by the heater 40, there are various alternate mechanisms for emitting electron beams from the emitter 20. Depending on the mechanism used, the structure and materials of the emitter 20 may vary.

Electrode plates 51 and 52 are disposed within the vacuum chamber 10 above and below the emitter 20 and wafer 30, respectively, for creating an electric field between the emitter 20 and wafer 30. External magnets 71 and 72 are placed above and below the vacuum chamber 10 for creating a magnetic field in the vacuum chamber 10. The electrode plates 51 and 52 and the external magnets 71 and 72 create electric and magnetic fields between the emitter 20 and the wafer 30, thereby controlling a path of an electron beam emitted from the emitter 20. More specifically, this arrangement makes it possible to focus the electron beam onto a correct position of the electron resist 32 coated on the wafer 30.

In a conventional EPL system described above, since the vacuum chamber 10 is separated from the external magnets 71 and 72, only the vacuum chamber 10 is vibrated due to vibration of the vacuum pump 60. In this case, paths of electron beams emitted from the emitter 20 are curved, thereby making it difficult to form a pattern having a nanometer-scale line width.

Another drawback of a conventional EPL system is that since the vacuum chamber 10 is manufactured from a ferromagnetic material, such as a steel plate, a magnetic flux created by the external magnets 71 and 72 is not concentrated between the emitter 20 and the wafer 30, but rather leaks through the vacuum chamber 10. Thus, it is difficult to create a uniform electric field between the emitter 20 and the wafer 30. Further, the manufacturing cost is high because the system requires the use of very large external magnets 71 and 72 to create a magnetic field of sufficient strength.

SUMMARY OF THE INVENTION

The present invention provides an electron-beam focusing apparatus constructed to create uniform electric and magnetic fields between a wafer and an electron-beam emitter and to minimize curving of a path of an electron beam due to vibration of a vacuum chamber, and an electron-beam projection lithography (EPL) system employing the electron-beam focusing apparatus.

It is a feature of an embodiment of the present invention to provide an electron-beam focusing apparatus for controlling a path of electron beams emitted from an electron-beam emitter in an electron-beam projection lithography (EPL) system including top and bottom magnets for creating a magnetic field within a vacuum chamber, the top and bottom magnets disposed above and below the vacuum chamber into which a wafer is loaded, respectively; upper and lower pole pieces magnetically contacting the top and bottom magnets, respectively, the upper and lower pole pieces penetrating a top wall and a bottom wall of the vacuum chamber, respectively; and upper and lower projections having a circular shape, extending outwardly from facing surfaces of the upper and lower pole pieces, respectively.

The apparatus may additionally include rubber plates containing a ferromagnetic material disposed between the top magnet and upper pole piece and between the bottom magnet and lower pole piece.

Preferably, the top and bottom magnets are capable of moving up and down, and include an electromagnet including a core made of a ferromagnetic material and a coil wound around an outer circumference of the core.

Preferably, the vacuum chamber is manufactured from a non-magnetic material, such as aluminum or aluminum alloy.

Preferably, an inside diameter of the upper projections and an inside diameter of the lower projections are greater than an outside diameter of the wafer. More preferably, the inside diameters of the upper and lower projections are greater than or equal to approximately 1.3 times greater than the outside diameter of the wafer.

The apparatus may further include upper and lower electrode plates for creating an electric field between the wafer and the electron-beam emitter, the upper and lower electrode plates disposed opposite to each other at the upper and lower projections, respectively, and spaced apart from each other by a predetermined distance. Preferably, an outside diameter of the upper electrode plate and an outside diameter of the lower electrode plate are greater than an outside diameter of the wafer. More preferably, the upper and lower electrode plates have outside diameters greater than or equal to approximately 1.3 times greater than the outside diameter of the wafer.

It is another feature of an embodiment of the present invention to provide an electron-beam projection lithography (EPL) system, including a vacuum chamber defining a space into which a wafer is loaded; an electron-beam emitter disposed opposite to the wafer within the vacuum chamber and spaced apart from the wafer by a predetermined distance, the electron beam emitter for emitting electron beams onto the wafer; and an electron-beam focusing apparatus for controlling paths of the electron beams emitted from the electron-beam emitter, the electron-beam focusing apparatus including: top and bottom magnets for creating a magnetic field within a vacuum chamber, the top and bottom magnets disposed above and below the vacuum chamber into which a wafer is loaded, respectively; upper and lower pole pieces magnetically contacting the top and bottom magnets, respectively, the upper and lower pole pieces penetrating a top wall and a bottom wall of the vacuum chamber, respectively; and upper and lower projections having a circular shape, extending outwardly from facing surfaces of the upper and lower pole pieces, respectively.

The system may additionally include rubber plates containing a ferromagnetic material disposed between the top magnet and upper pole piece and between the bottom magnet and lower pole piece.

Preferably, the top and bottom magnets are capable of moving up and down, and include an electromagnet including a core made of a ferromagnetic material and a coil wound around an outer circumference of the core.

Preferably, the vacuum chamber is manufactured from a non-magnetic material, such as aluminum or aluminum alloy.

Preferably, an inside diameter of the upper projections and an inside diameter of the lower projections are greater than an outside diameter of the wafer. More preferably, the inside diameters of the upper and lower projections are greater than or equal to approximately 1.3 times greater than the outside diameter of the wafer.

The apparatus may further include upper and lower electrode plates for creating an electric field between the wafer and the electron-beam emitter, the upper and lower electrode plates disposed opposite to each other at the upper and lower projections, respectively, and spaced apart from each other by a predetermined distance. Preferably, an outside diameter of the upper electrode plate and an outside diameter of the lower electrode plate are greater than an outside diameter of the wafer. More preferably, the upper and lower electrode plates have outside diameters greater than or equal to approximately 1.3 times greater than the outside diameter of the wafer.

The system may additionally include an emitter holder for supporting the electron-beam emitter disposed on one of the upper and lower electrode plates, and a wafer holder for supporting the wafer disposed on the other of the upper and lower electrode plates. Preferably, the emitter holder and the wafer holder are made of quartz glass.

The above configuration according to an embodiment of the present invention provides a uniform electric/magnetic field between the wafer and the electron-beam emitter while minimizing the curving of the path of electron beams due to vibration of the vacuum chamber.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2003-14483, filed on Mar. 7, 2003, and entitled: "Electron-Beam Focusing Apparatus and Electron-Beam Projection Lithography System Employing the Same," is incorporated by reference herein in its entirety.

An electron-beam focusing apparatus and an electron-beam projection lithography (EPL) system according to a preferred embodiment of the present invention will now be described with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals in different drawings represent the same element.

Figure 2:
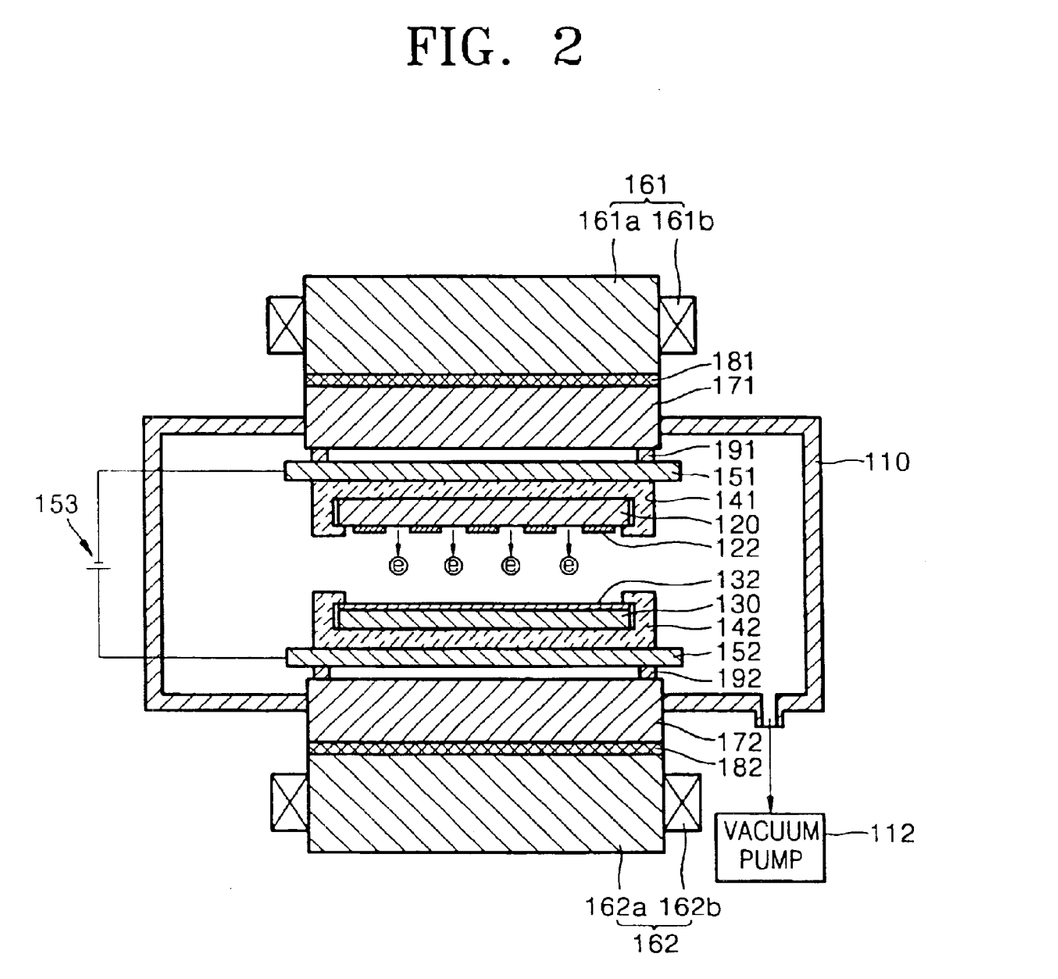
FIG. 2 illustrates a configuration of an electron-beam focusing apparatus and an EPL system having the same according to a preferred embodiment of the present invention.
Figure 3:
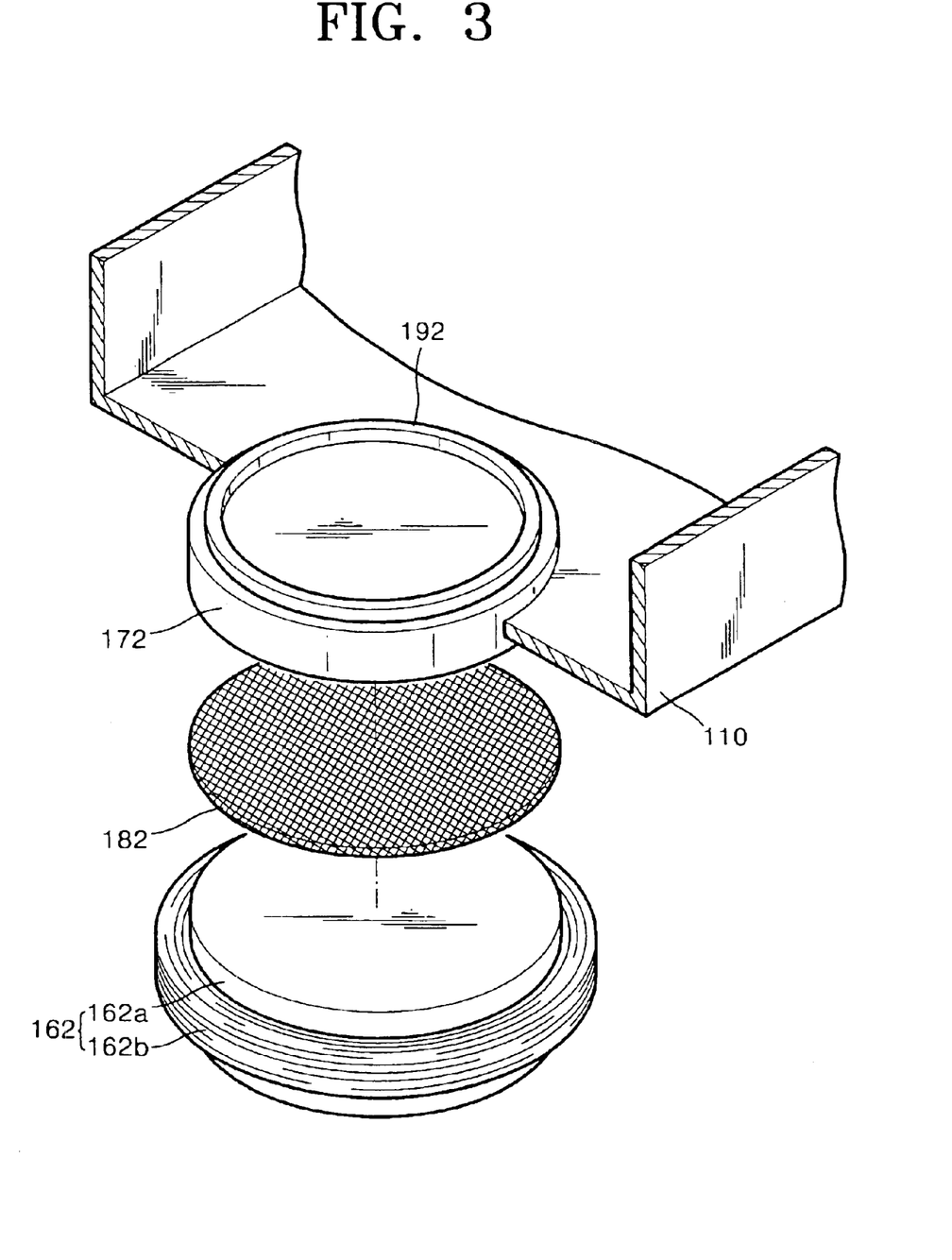
FIG. 3 illustrates an exploded view of a lower portion of the electron-beam focusing apparatus shown in FIG. 2.

Referring to FIGS. 2 and 3, an EPL system according to the preferred embodiment of the present invention includes a vacuum chamber 110 defining a space into which a wafer 130 is loaded, an electron-beam emitter 120 installed in the vacuum chamber 110, and an electron-beam focusing apparatus for controlling a path of electron beams emitted from the electron-beam emitter 120.

The vacuum chamber 110 is connected to a vacuum pump 112 for maintaining the interior of the chamber 110 under vacuum. Preferably, the vacuum chamber 110 is manufactured of a non-magnetic material. This selection of materials is to prevent the leakage of a magnetic flux created by top and bottom magnets 161 and 162, described later, through the vacuum chamber 110. Although the vacuum chamber 110 may be made of plastic, since the vacuum chamber 110 requires a sufficient strength to prevent deformation under a high vacuum pressure, it is preferably manufactured from aluminum or aluminum alloy having a magnetic permeability of approximately one (1) and an appropriate strength.

The wafer 130 is disposed on one side of the interior of the vacuum chamber 110 and supported by a wafer holder 142. An electron resist 132 is coated on a surface of the wafer 130.

The electron-beam emitter 120, which is supported by an emitter holder 141, and the wafer 130 are disposed opposite to each other within the vacuum chamber 110 and spaced a predetermined distance apart from each other. A mask 122 patterned in a predetermined pattern is formed on a surface of the electron-beam emitter 120 facing the wafer 130. Electron beams are emitted from the emitter through a portion exposed by the mask 122. The electron beams thus emitted pattern the electron resist 132 coated on the opposing surface of the wafer 130 in the same pattern as the exposed surface of the emitter 120.

As previously described, there may be various mechanisms for emitting electron beams from the electron-beam emitter 120 available. For example, in a case of heating the electron-beam emitter 120 for emission of electron beams, a heater (not shown) may be placed at a rear side of the emitter 120.

In the preferred embodiment of the present invention, the electron-beam focusing apparatus includes the top and bottom magnets 161 and 162 disposed above and below the vacuum chamber 110, respectively, upper and lower pole pieces 171 and 172, which magnetically contact the top and bottom magnets 161 and 162, respectively, disposed to penetrate a top wall and a bottom wall of the vacuum chamber 110, respectively, and upper and lower projections 191 and 192 extending outwardly from facing surfaces of the upper and lower pole pieces 171 and 172, respectively.

The top and bottom magnets 161 and 162 disposed above and below the vacuum chamber 110 are separated from the top and bottom walls of the vacuum chamber 110 by a predetermined distance, respectively, and create a magnetic field within the vacuum chamber 110. For the top and bottom magnets 161 and 162, it is desirable to use an electromagnet that can easily adjust the strength of a magnetic field rather than a permanent magnet. In a case of using an electromagnet, the top and bottom magnets 161 and 162, respectively, include cores 161a and 162a, each made of a ferromagnetic material, and coils 161b and 162b wound around outer circumferences of the cores 161a and 162a.

The upper and lower pole pieces 171 and 172, which magnetically contact the cores 161a and 162a of the top and bottom magnets 161 and 162, respectively, penetrate the top and bottom walls of the vacuum chamber 110, respectively. The upper and lower pole pieces 171 and 172 thus installed act to direct the magnetic flux created by the top and bottom magnets 161 and 162 into the vacuum chamber 110. In particular, if the vacuum chamber 110 is manufactured from a nonmagnetic substance, a leakage of the magnetic flux through the vacuum chamber 110 may be suppressed.

Preferably, the top and bottom magnets 161 and 162 are capable of moving up and down. According to the above configuration, the vacuum chamber 110 equipped with the upper and lower pole pieces 171 and 172 is firstly positioned between the top and bottom magnets 161 and 162. Then, the top and bottom magnets 161 and 162 move toward the upper and lower pole pieces 171 and 172 so that they adhere by a predetermined pressure to the upper and lower pole pieces 171 and 172, respectively. Thus, this arrangement prevents leakage at the interfaces between the top magnet 161 and upper pole piece 171 and between the bottom magnet 162 and lower pole piece 172.

However, where the adhesion interfaces on the top magnet 161 and upper pole piece 171 (or those on the bottom magnet 162 and lower pole piece 172) are not completely parallel to each other, the top and bottom magnets 161 and 162 may not adhere completely to the upper and lower pole pieces 171 and 172, respectively. To prevent the occurrence of an incomplete adhesion, it is desirable to insert rubber plates 181 and 182 containing a ferromagnetic material, such as iron, between the top magnet 161 and upper pole piece 171 and between the bottom magnet 162 and lower pole piece 172, respectively. Thus, the top and bottom magnets 161 and 162 magnetically and completely contact the upper and lower pole pieces 171 and 172, respectively, due to the presence of the rubber plates 181 and 182, which are flexible. This arrangement effectively prevents the leakage of magnetic flux between the top magnet 161 and upper pole piece 171 and between the bottom magnet 162 and lower pole piece 172.

The upper and lower projections 191 and 192, which have a circular shape, make the distribution of a magnetic field created between the electron-beam emitter 120 and wafer 130 uniform.

Figure 4A:
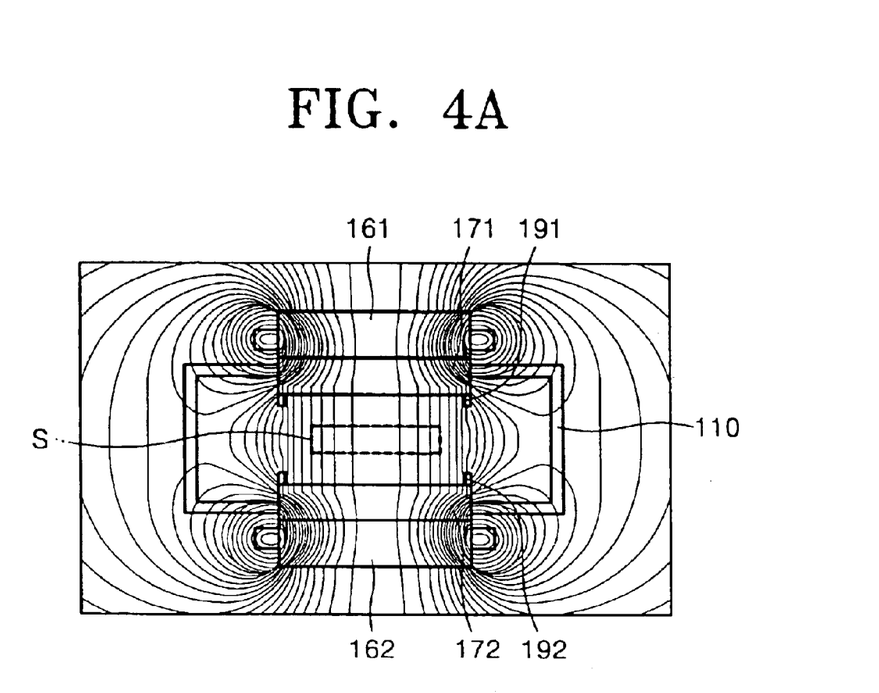
FIGS. 4A and 4B illustrate a distribution of magnetic flux created around top and bottom magnets and within a vacuum chamber shown in FIG. 2.
Figure 4B:
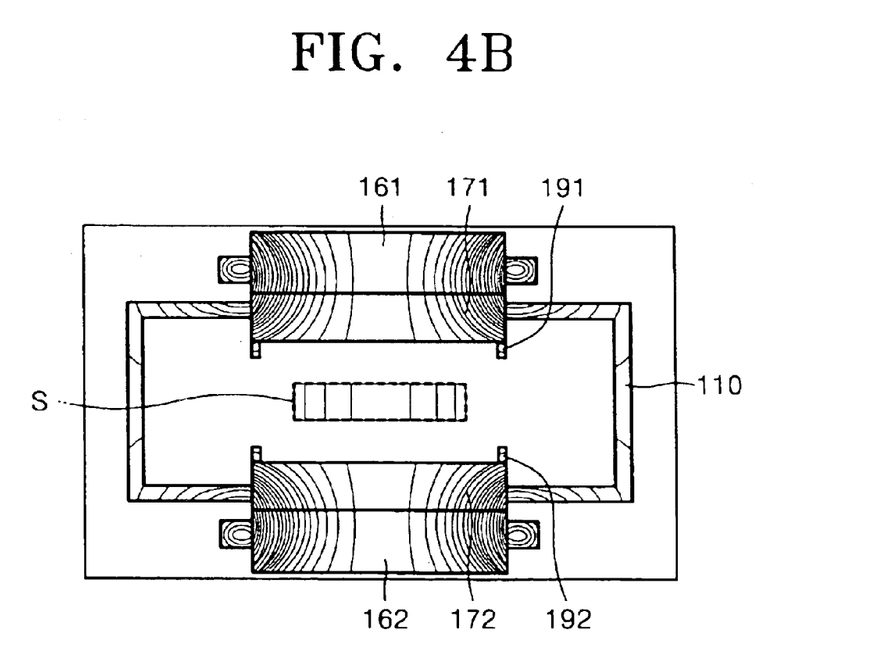

FIGS. 4A and 4B illustrate a distribution of a magnetic flux created around the top and bottom magnets 161 and 162 and within the vacuum chamber 110. Referring to FIGS. 4A and 4B, the top and bottom magnets 161 and 162 create a magnetic field around the top and bottom magnets 161 and 162 and within the vacuum chamber 110. In this case, the magnetic flux created by the top and bottom magnets 161 and 162 is attracted into the vacuum chamber 110 by the upper and lower pole pieces 171 and 172. Furthermore, since the vacuum chamber 110 is fabricated from a nonmagnetic material, a leakage of the magnetic flux through the vacuum chamber 110 may be prevented. It is evident from the drawings that a uniform magnetic field is created around a center of the vacuum chamber 110 by the upper and lower projections 191 and 192 extending outwardly from facing surfaces of the upper and lower pole pieces 171 and 172, respectively. In particular, the magnetic field at central portions of the upper and lower pole pieces 171 and 172 is more uniform than that on edges thereof. Thus, it is desirable that the respective inside diameters of the upper and lower projections 191 and 192 are greater than an outside diameter of the wafer 130 so that the electron-beam emitter 120 and wafer 130 can be placed within a range S of a completely uniform magnetic field. Respective inside diameters of the upper and lower projections 191 and 192 are preferably greater than or equal to approximately 1.3 times greater than, for example, approximately 1.5 times, the outside diameter of the wafer 130.

Returning to FIG. 2, upper and lower electrode plates 151 and 152 are disposed between the upper projection 191 and electron-beam emitter 120 and between the lower projection 192 and wafer 130, respectively. The upper and lower electrode plates 151 and 152 are disposed opposite and spaced apart from each other by a predetermined distance. A power supply 153 is connected to the upper and lower electrode plates 151 and 152 for creating an electric field therebetween.

Figure 5A:
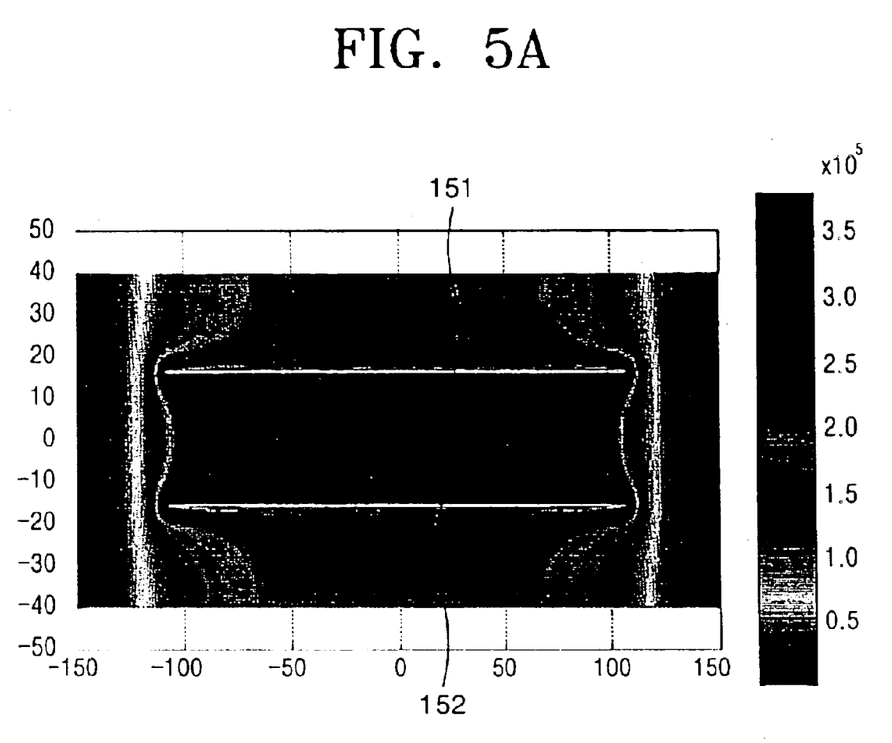
FIG. 5A illustrates a distribution of an electric field created within the vacuum chamber shown in FIG. 2.
Figure 5B:
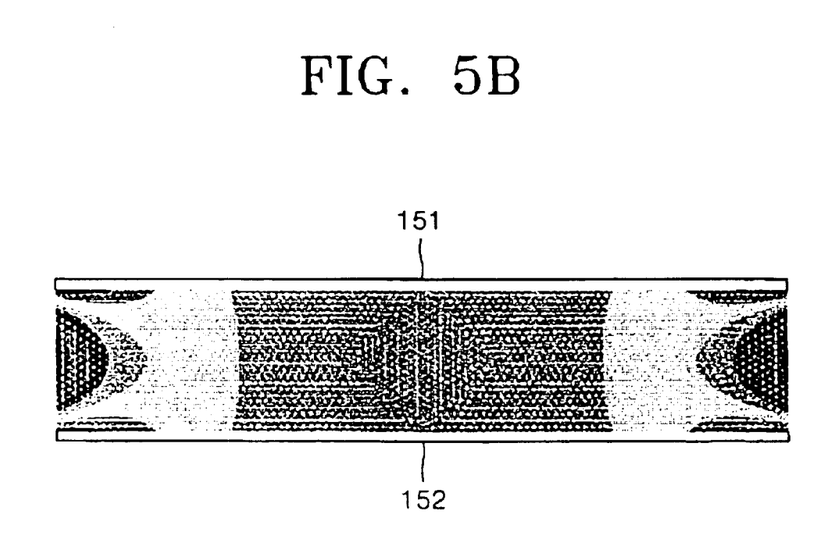
FIG. 5B illustrates a distribution of an electric field created between upper and lower electrode plates shown in FIG. 2.

FIGS. 5A and 5B illustrate a distribution of electric fields created within the vacuum chamber 110 and between the upper and lower electrode plates 151 and 152, respectively.

It may be seen from FIGS. 5A and 5B that an electric field created in the vacuum chamber 110 is uniformly distributed around a central portion between the upper and lower electrode plates 151 and 152. Thus, it is desirable to dispose the electron-beam emitter 120 and wafer 130 at a center of the vacuum chamber 110 between the upper and lower electrode plates 151 and 152. Furthermore, it is desirable that respective outside diameters of the upper and lower electrode plates 151 and 152 are greater than that of the wafer 130 so that the electron-beam emitter 120 and wafer 130 can be positioned within the range of a completely uniform electric field. Preferably, the respective upper and lower electrode plates 151 and 152 have outside diameters greater than or equal to approximately 1.3 times greater than, for example, approximately 1.5 times, the outside diameter of the wafer 130.

Returning to FIG. 2, while the emitter holder 141 for supporting the electron-beam emitter 120 is placed on a bottom surface of the upper electrode plate 151, the wafer holder 142 for supporting the wafer 130 is placed on a top surface of the lower electrode plate 152. The emitter holder 141 and wafer holder 142 are constructed to removably support the emitter 120 and wafer 130, respectively. Furthermore, it is desirable that the emitter holder 141 and wafer holder 142 are made of quartz glass that does not affect the electric and magnetic fields created in the vacuum chamber 110 and hardly generates any particles.

As described above, an electron beam focusing apparatus according to an embodiment of the present invention provides uniform electric and magnetic fields at the central portion of the vacuum chamber, i.e., between the emitter and wafer, while preventing a leakage of a magnetic flux through the vacuum chamber. Furthermore, the top and bottom magnets disposed outside of the vacuum chamber adhere closely to the upper and lower pole pieces fixedly installed into the vacuum chamber, thus minimizing the curving of the electron beam path due to vibration of the vacuum chamber. This configuration facilitates formation of a miniature pattern with a nanometer-scale line width.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electron-beam focusing apparatus for controlling a path of electron beams emitted from an electron-beam emitter in an electron-beam projection lithography (EPL) system, the apparatus comprising:
   top and bottom magnets for creating a magnetic field within a vacuum chamber, the top and bottom magnets disposed above and below the vacuum chamber into which a wafer is loaded, respectively;
   upper and lower pole pieces magnetically contacting the top and bottom magnets, respectively, the upper and lower pole pieces penetrating a top wall and a bottom wall of the vacuum chamber, respectively; and
   upper and lower projections having a circular shape, extending outwardly from facing surfaces of the upper and lower pole pieces, respectively.

2. The apparatus as claimed in claim 1, further comprising rubber plates containing a ferromagnetic material disposed between the top magnet and upper pole piece and between the bottom magnet and lower pole piece.

3. The apparatus as claimed in claim 1, wherein the top and the bottom magnets are capable of moving up and down.

4. The apparatus as claimed in claim 1, wherein the top and bottom magnets are electromagnets comprising:
   a core made of a ferromagnetic material; and
   a coil wound around an outer circumference of the core.

5. The apparatus as claimed in claim 1, wherein the vacuum chamber is manufactured from a non-magnetic material.

6. The apparatus as claimed in claim 5, wherein the vacuum chamber is manufactured from aluminum or aluminum alloy.

7. The apparatus as claimed in claim 1, wherein an inside diameter of the upper projections and an inside diameter of the lower projections are greater than an outside diameter of the wafer.

8. The apparatus as claimed in claim 7, wherein the inside diameters of the upper and lower projections are greater than or equal to approximately 1.3 times greater than the outside diameter of the wafer.

9. The apparatus as claimed in claim 1, further comprising upper and lower electrode plates for creating an electric field between the wafer and the electron-beam emitter, the upper and lower electrode plates disposed opposite to each other at the upper and lower projections, respectively, and spaced apart from each other by a predetermined distance.

10. The apparatus as claimed in claim 9, wherein an outside diameter of the upper electrode plate and an outside diameter of the lower electrode plate are greater than an outside diameter of the wafer.

11. The apparatus as claimed in claim 10, wherein the upper and lower electrode plates have outside diameters greater than or equal to approximately 1.3 times greater than the outside diameter of the wafer.

12. An electron-beam projection lithography (EPL) system, comprising:
   a vacuum chamber defining a space into which a wafer is loaded;
   an electron-beam emitter disposed opposite to the wafer within the vacuum chamber and spaced apart from the wafer by a predetermined distance, the electron beam emitter for emitting electron beams onto the wafer; and
   an electron-beam focusing apparatus for controlling paths of the electron beams emitted from the electron-beam emitter, the electron-beam focusing apparatus including:
      top and bottom magnets for creating a magnetic field within the vacuum chamber, the top and bottom magnets disposed above and below the vacuum chamber into which a wafer is loaded, respectively;
      upper and lower pole pieces magnetically contacting the top and bottom magnets, respectively, the upper and lower pole pieces penetrating a top wall and a bottom wall of the vacuum chamber, respectively; and
      upper and lower projections having a circular shape, extending outwardly from facing surfaces of the upper and lower pole pieces, respectively.

13. The system as claimed in claim 12, further comprising rubber plates containing a ferromagnetic material disposed between the top magnet and the upper pole piece and between the bottom magnet and the lower pole piece.

14. The system as claimed in claim 12, wherein the top and the bottom magnets are capable of moving up and down.

15. The system as claimed in claim 12, wherein the top and the bottom magnets are electromagnets comprising:
   a core made of a ferromagnetic material; and
   a coil wound around an outer circumference of the core.

16. The system as claimed in claim 12, wherein the vacuum chamber is manufactured from a non-magnetic material.

17. The system as claimed in claim 16, wherein the vacuum chamber is manufactured from aluminum or aluminum alloy.

18. The system as claimed in claim 12, wherein an inside diameter of the upper projections and an inside diameter of the lower projections are greater than an outside diameter of the wafer.

19. The system as claimed in claim 18, wherein the inside diameters of the upper and lower projections are greater than or equal to approximately 1.3 times greater than the outside diameter of the wafer.

20. The system as claimed in claim 12, further comprising upper and lower electrode plates for creating an electric field between the wafer and the electron-beam emitter, the upper and lower electrode plates disposed opposite to each other at the upper and lower projections, respectively, and spaced apart from each other by a predetermined distance.

21. The system as claimed in claim 20, wherein an outside diameter of the upper electrode plate and an outside diameter of the lower electrode plate are greater than an outside diameter of the wafer.

22. The system as claimed in claim 21, wherein the upper and lower electrode plates have outside diameters greater than or equal to approximately 1.3 times greater than the outside diameter of the wafer.

23. The system as claimed in claim 20, further comprising:
   an emitter holder for supporting the electron-beam emitter disposed on one of the upper and lower electrode plates; and
   a wafer holder for supporting the wafer disposed on the other of the upper and lower electrode plates.

24. The system as claimed in claim 23, wherein the emitter holder and the wafer holder are made of quartz glass.

* * * * *